US008816364B2

(12) United States Patent
Suzuki et al.

(10) Patent No.: US 8,816,364 B2
(45) Date of Patent: Aug. 26, 2014

(54) DISPLAY APPARATUS

(75) Inventors: Takahito Suzuki, Tokyo (JP); Tomohiko Sagimori, Tokyo (JP); Hiroyuki Fujiwara, Tokyo (JP); Tomoki Igari, Tokyo (JP); Yusuke Nakai, Tokyo (JP); Hironori Furuta, Tokyo (JP); Mitsuhiko Ogihara, Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 13/555,241

(22) Filed: Jul. 23, 2012

(65) Prior Publication Data

US 2012/0286303 A1 Nov. 15, 2012

Related U.S. Application Data

(62) Division of application No. 12/071,943, filed on Feb. 28, 2008, now Pat. No. 8,269,314.

(30) Foreign Application Priority Data

Mar. 7, 2007 (JP) ................................ 2007-057391

(51) Int. Cl.
| | | |
|---|---|---|
| H01L 33/08 | (2010.01) | |
| H01L 25/075 | (2006.01) | |
| H01L 33/64 | (2010.01) | |
| H01L 51/00 | (2006.01) | |
| H01L 33/20 | (2010.01) | |

(52) U.S. Cl.
CPC ......... *H01L 25/0753* (2013.01); *H01L 51/0024* (2013.01); *H01L 33/20* (2013.01); *H01L 33/64* (2013.01)
USPC .................................... 257/88; 257/E33.075

(58) Field of Classification Search
USPC ............................................ 257/88, E33.075
See application file for complete search history.

(56) References Cited

U.S. PATENT DOCUMENTS

| | | | | |
|---|---|---|---|---|
| 6,541,908 | B1* | 4/2003 | Cheung et al. | 313/503 |
| 6,630,980 | B2* | 10/2003 | Sobrinho | 349/158 |
| 6,633,123 | B2* | 10/2003 | Tazawa | 313/506 |
| 6,857,767 | B2* | 2/2005 | Matsui et al. | 362/373 |
| 7,045,438 | B2* | 5/2006 | Yamazaki et al. | 438/455 |
| 7,172,909 | B2* | 2/2007 | Liu et al. | 438/26 |
| 7,528,421 | B2 | 5/2009 | Mazzochette | |
| 2001/0040645 | A1 | 11/2001 | Yamazaki | |
| 2002/0043929 | A1 | 4/2002 | Tazawa | |
| 2003/0072153 | A1 | 4/2003 | Matsui et al. | |
| 2005/0285518 | A1 | 12/2005 | Cok | |
| 2006/0197102 | A1* | 9/2006 | Ogihara et al. | 257/99 |
| 2008/0225523 | A1 | 9/2008 | De Samber et al. | |

FOREIGN PATENT DOCUMENTS

| | | |
|---|---|---|
| EP | 1 699 091 A2 | 9/2006 |
| JP | 6-340118 | 12/1994 |
| JP | 2006-65011 | 3/2006 |
| JP | 2006-261218 | 9/2006 |

(Continued)

*Primary Examiner* — Long K Tran
*Assistant Examiner* — Jordan Klein
(74) *Attorney, Agent, or Firm* — Rabin & Berdo, P.C.

(57) ABSTRACT

The present invention supplied a display apparatus using plastic substrate instead of glass substrate, which can solve such problems that the plastic substrate has a low heat conductivity and its heat release performance becomes bad so that it is difficult to obtain stable performance and reliability. In the display apparatus being formed by bonding semiconductor thin film element on a plastic substrate, a thin film metal layer is formed on surface of the semiconductor thin film element for promoting heat release.

18 Claims, 15 Drawing Sheets

(56) References Cited

FOREIGN PATENT DOCUMENTS

| JP | 2006-269716 | 10/2006 |
|---|---|---|
| JP | 2006-319099 | 11/2006 |
| WO | WO 01/24290 A1 | 4/2001 |
| WO | WO 2006/103596 A2 | 10/2006 |
| WO | WO 2007/008717 A1 | 1/2007 |

* cited by examiner

US 8,816,364 B2

DISPLAY APPARATUS

This is a Divisional of U.S. application Ser. No. 12/071,943, filed on Feb. 28, 2008, and allowed on May 15, 2012, the subject matter of which is incorporated herein by reference.

BACKGROUND OF THE INVENTION

1. Field of the Invention

The invention relates to a display apparatus formed by bonding semiconductor thin film element on a plastic substrate.

2. Related Background Art

In recent years, display apparatuses are unceasingly making progress on development for lightening and thinning, and the demand for flexible display apparatuses represented by electronic paper is increasing continuously. In the past, a thin type display apparatus mainly adopted a rigid glass substrate, however, the glass substrate is weak with respect to impact, so that it easily incurs damage such as a break, crack, slit or the like. Further, because the glass substrate has a bigger specific gravity, a disadvantage is produced that the whole apparatus becomes heavy. Therefore, instead of the glass substrate, a plastic substrate is used so as to improve impact ability and to lighten the whole apparatus.

However, in the display apparatus using the plastic substrate instead of the glass substrate, because the heat conductivity of the plastic substrate is low so that the heat release performance of the plastic substrate is weak, it is difficult to obtain stable performance and reliability.

[Patent Document 1] Japanese Unexamined Patent Application Publication No. 2006-269716

SUMMARY OF THE INVENTION

It is, therefore, an object of the invention to provide a display apparatus capable of solving the above problem.

According to the present invention, there is provided a display apparatus formed by bonding a semiconductor thin film element on a plastic substrate, comprising a thin film metal layer for promoting heat release that is formed on a surface of the semiconductor thin film element.

According to the display apparatus of the present invention, because the thin film metal layer formed on the surface of the semiconductor thin film element promotes heat release, it is possible to effectively release heat produced inside the semiconductor thin film element. As a result, it is possible to obtain such a display apparatus having long life, high output and high reliability.

The above and other objects and features of the present invention will become apparent from the following detailed description and the appended claims with reference to the accompanying drawings.

DETAILED DESCRIPTION OF THE PREFERRED EMBODIMENTS

Embodiments of the invention will be described in detail hereinbelow with reference to the drawings.

Embodiment 1

Figure 1:
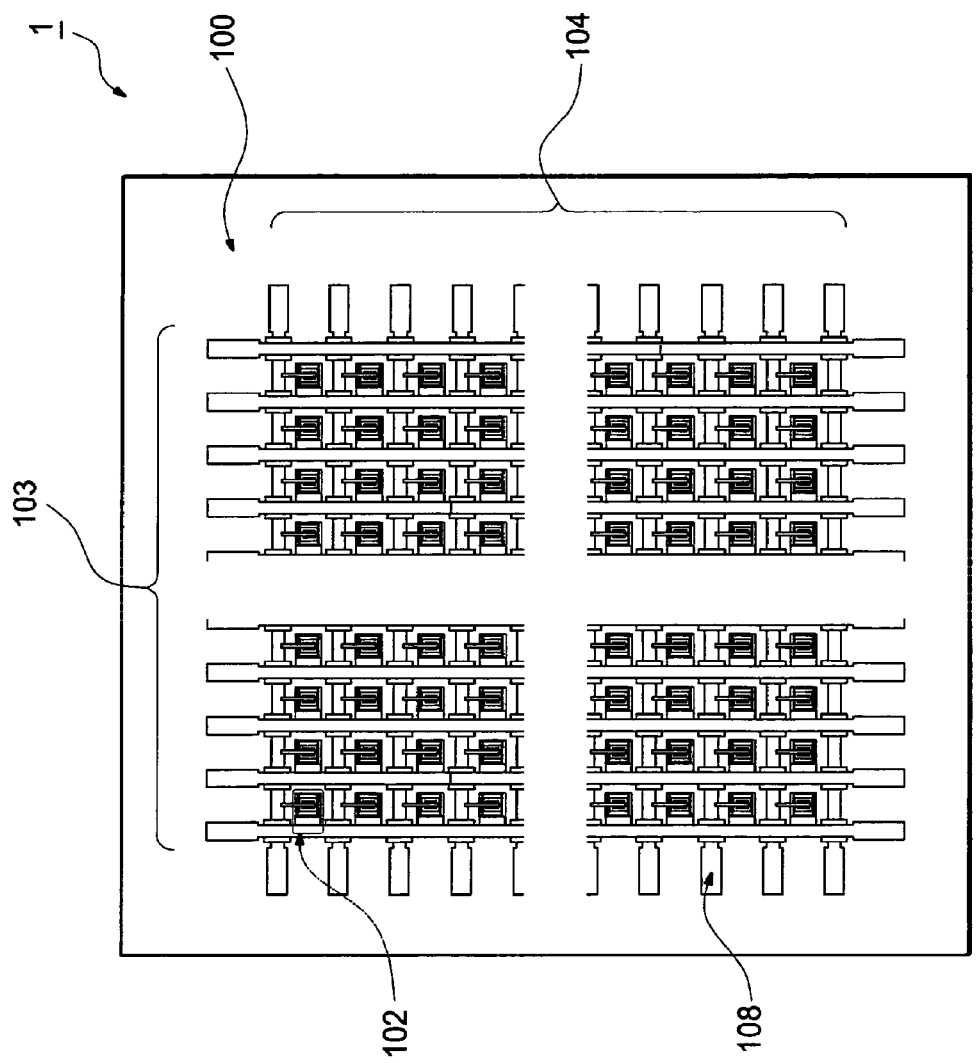
FIG. 1 is a plane drawing showing overall structure of a display apparatus in Embodiment 1.

FIG. 1 is a plane drawing showing overall structure of a display apparatus in Embodiment 1.

As shown by FIG. 1, a display apparatus 1 of Embodiment 1 is formed by arranging a plurality of thin film LEDs 102 serving as semiconductor thin film elements on a plastic substrate 100 with a matrix manner. Further, anodes in the same queue of the thin film LEDs 102 are connected with a transverse wiring 104 having a connection use pad 108, and cathodes in the same row of the thin film LEDs 102 are connected with a vertical wiring 103 having a connection use pad 108.

Figure 2:
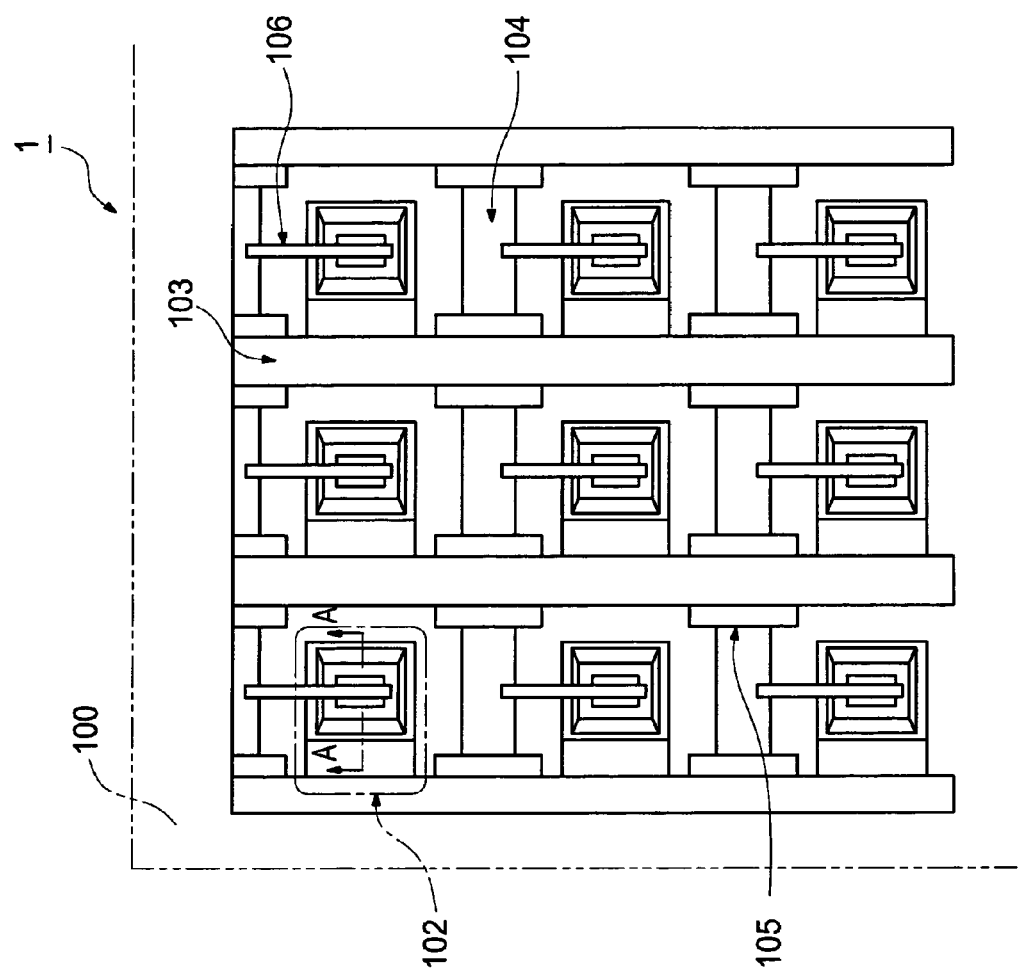
FIG. 2 is a plane enlargement drawing showing a display apparatus in Embodiment 1.
Figure 3:
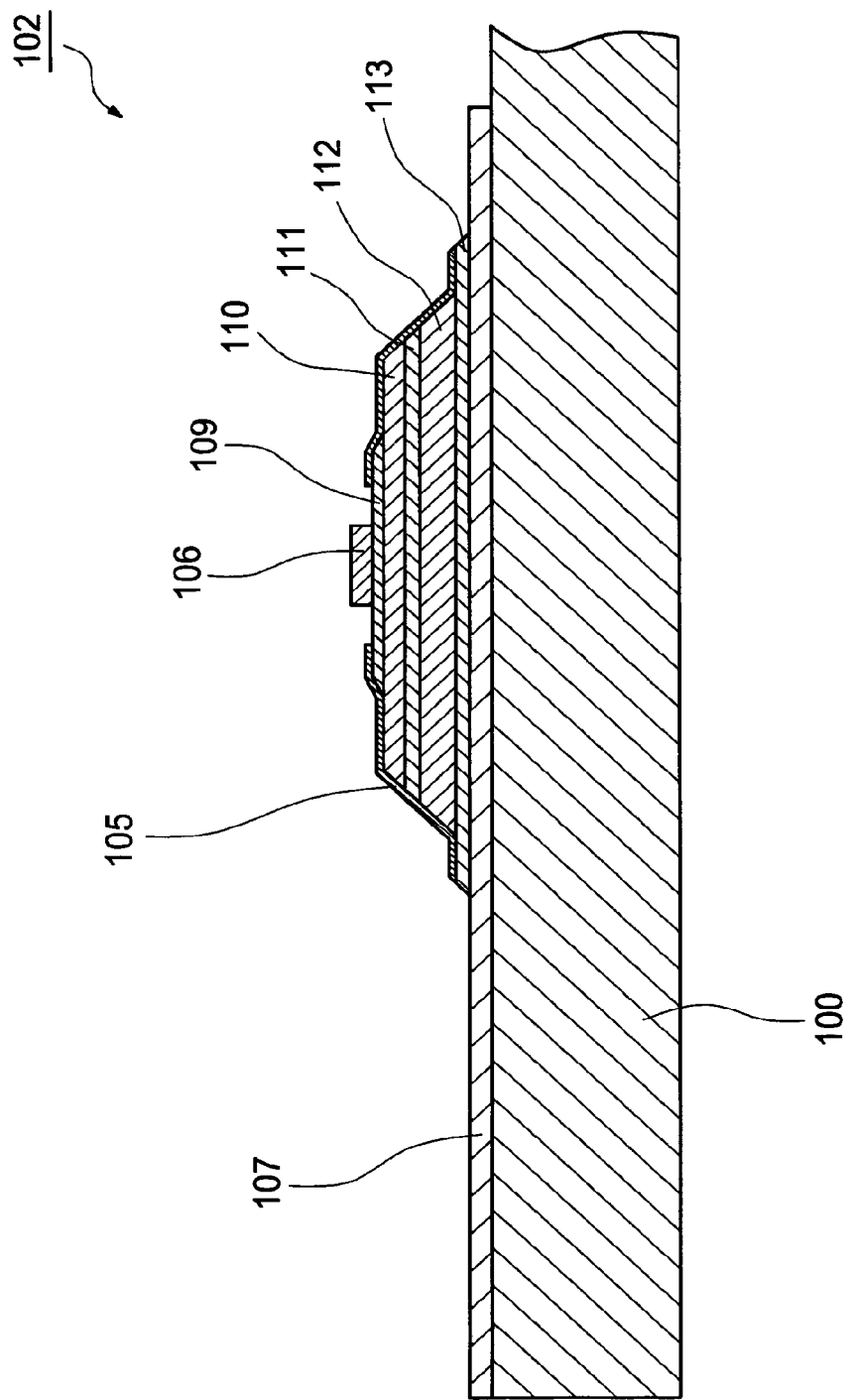
FIG. 3 is a sectional enlargement drawing showing a display apparatus in Embodiment 1.

FIG. 2 is a plane enlargement drawing showing a display apparatus in Embodiment 1; and FIG. 3 is a sectional enlargement drawing showing a display apparatus in Embodiment 1. The FIG. 3 is an A-A sectional diagram including the thin film LED 102 in the FIG. 2.

Next to explain the display apparatus 1 and the thin film LED 102 in detail through using the FIG. 2 and the FIG. 3.

As shown by the FIG. 2, the display apparatus 1 comprises a plastic substrate 100, thin film LED 102 serving as semiconductor thin film element, vertical distribution 103, transverse wiring 104, interlayer insulation film 105 and connection wiring (transverse) 106.

The plastic substrate 100 is used for mounting the thin film LED 102, and it is a thin plate made from organic material represented by polyethylene terephthalate (PET). Moreover, as the organic material, polyimide, polycarbonate, polyethylene naphthalate or aramid can also be adopted. The thin film LED 102 is a LED of M dots×N dots formed on the plastic substrate 100 in a thin film shape. The vertical wiring 103 is an electroconductive thin film to connect with a cathode of the thin film LED 102 formed on the plastic substrate 100. The vertical wiring 103 is a metal wiring obtained through accumulating metal material such as gold or aluminum, or above-stated metal material with nickel, or titanium or the like onto the plastic substrate 100 in a thin film lamination, and it connects with cathodes of respective thin film LEDs 102. In addition, the vertical wiring 103 and the inner surface electrode 107 are integrated in the present Embodiment.

The transverse wiring 104 is an electroconductive thin film to connect with an anode of the thin film LED 102 formed on the plastic substrate 100. The transverse wiring 104 is a metal wiring obtained through accumulating metal material such as gold or aluminum, or above-stated metal material with nickel, or titanium or the like onto the plastic substrate 100 in a thin film lamination, and it connects with anodes of respective thin film LEDs 102.

The interlayer insulation layer 105 is accumulated for obtaining an interlayer insulation between the vertical wiring 103 and the transverse wiring 104, e.g. it is an insulation thin film such as oxidation silicon and etc. The connection wiring (transverse) 106 is metal wiring obtained through accumulating metal material such as gold or aluminum, or above-stated metal material with nickel, or titanium or the like used for connecting an upper contact layer 109 (FIG. 3) described below and the transverse wiring 104 onto the plastic substrate 100 in a thin film lamination.

As shown by FIG. 3, an upper contact layer 109, an upper clad layer 110, an active layer 111, a lower clad layer 112 and a lower contact layer 113 are accumulated. Inclined side surfaces of such layers are covered by the interlayer insulation film 105, so that the thin film LED 102 is accumulated on the plastic substrate 100 via the inner surface electrode 107.

The inner surface electrode 107 is an electrode for supplying electric field intensity with the upper contact layers 109 in order to make the thin film LED 102 emit light; in the present invention, the inner surface electrode 107 can also be used as a metal layer for effectively releasing heat produced when making the thin film LED 102 emit light. In the present Embodiment, the inner surface electrode 107 is integrated with the vertical wiring 103 (FIG. 2).

That is, the thin film LED 102 is characterized in that: it is solidly bonded on the surface of the inner surface electrode 107 serving as a heat release layer, for example, a metal layer of Au, AuGeNi, Al, AlNd, Ti, Ni, Pt, Ag, Pd, Cu and etc.; or for example, a transparent electrode layer of ITO, ZnO2, In2O3 and etc., through intermolecular force of hydrogen bond. Moreover, such heat release layers is formed by well-known vapor deposition method and sputter method, and the heat conductivity is better above 50 W/mK.

As mentioned above, because the thin film LED 102 is solidly bonded with the inner surface electrode 107 formed as heat release layer through intermolecular force of hydrogen bond, the bonding surface of the thin film LED 102 and the bonded surface of the plastic substrate are controlled as the surface roughness, that is, the typical height difference between the concave peak or convex peak and valley is about 5 nm below.

In order to further strengthen bonding force, it is better to clean and activate these bonding surfaces by an energy wave (e.g. plasma apparatus and so on). Moreover, coating with an active agent is also a method for activating the bonding surface.

After LED thin film plurally and integratively generated in a rectangle shape is solidly bonded on the surface of the inner surface electrode 107 formed as a heat release layer by intermolecular force of hydrogen bond, the thin film LED 102 is formed by a photolithographic etching method.

The above-stated LED thin film is grown on a GaAs substrate, a sapphire substrate, an InP substrate, a glass substrate, a quartz substrate or a Si substrate via a sacrificial layer by well-known metal organic chemical vapor deposition method (MOVPE method), metal organic vapor phase epitaxy method (MOVPE method), molecular beam epitaxy method (MBE method) and etc.

Because the LED thin film (thin film LEDs 102) can be thinned to a thickness below e.g. 5 μm, the LED thin film is characterized in an extremely strong flexibility. Moreover, unlike liquid crystal and organic EL, the LED thin film (thin film LEDs 102) uses material made by semiconductor epitaxial growth method, material with a high quality and a high reliability. Therefore, it is possible to ensure high quality and high reliability.

The LED thin film is formed by epitaxial growth so as to furnish a sacrificial layer capable of performing a selective etching. Through selectively etching the sacrificial layer, a LED thin film is formed by using lift-off method. Moreover, in the case that it is compound semiconductor such as LED elements of GaN system and etc. so that it is difficult to selectively etch the sacrificial layer, as a means to thinning thin film, it is possible to use a treatment to grind the inner surface of substrate. In the case, the LED thin film may be thinned so that a thickness including an epitaxial growth layer needed for LED emitting element is about 50 μm below, the thinned LED thin film may be used as LED emitting element. The LED thin films formed on the flexible substrate can be arranged to form the thin film LED 102 by well-known photolithographic technology.

Through injecting current between the transverse wiring 104 and the vertical wiring 103 toward a bias voltage direction, the thin film LED 102 formed on the plastic substrate 100 emits light. Because the thin film LED 102 can be thinned to a thickness below e.g. 5 μm, it can have a flexibility. Even if it is formed on plastic substrate 100, it can operate as an emitting element capable of ensuring high quality and high reliability. In addition, when thin film LED 102 operates, huge heat happens due to absorption of power that does not contribute to emitting light or emitted light. Here, according to the present invention, the heat can be effectively released toward the outside of the apparatus via the inner surface electrode 107 formed as a heat release layer.

Explanation of Effect

As mentioned above, through interposing the inner surface electrode 107 formed as heat release layer between the plastic substrate 100 and the thin film LED 102, it is possible to effectively release heat produced inside the thin film LED 102. As a result, it is possible to obtain such display apparatus having long life, high output and high reliability.

Embodiment 2

Figure 4:
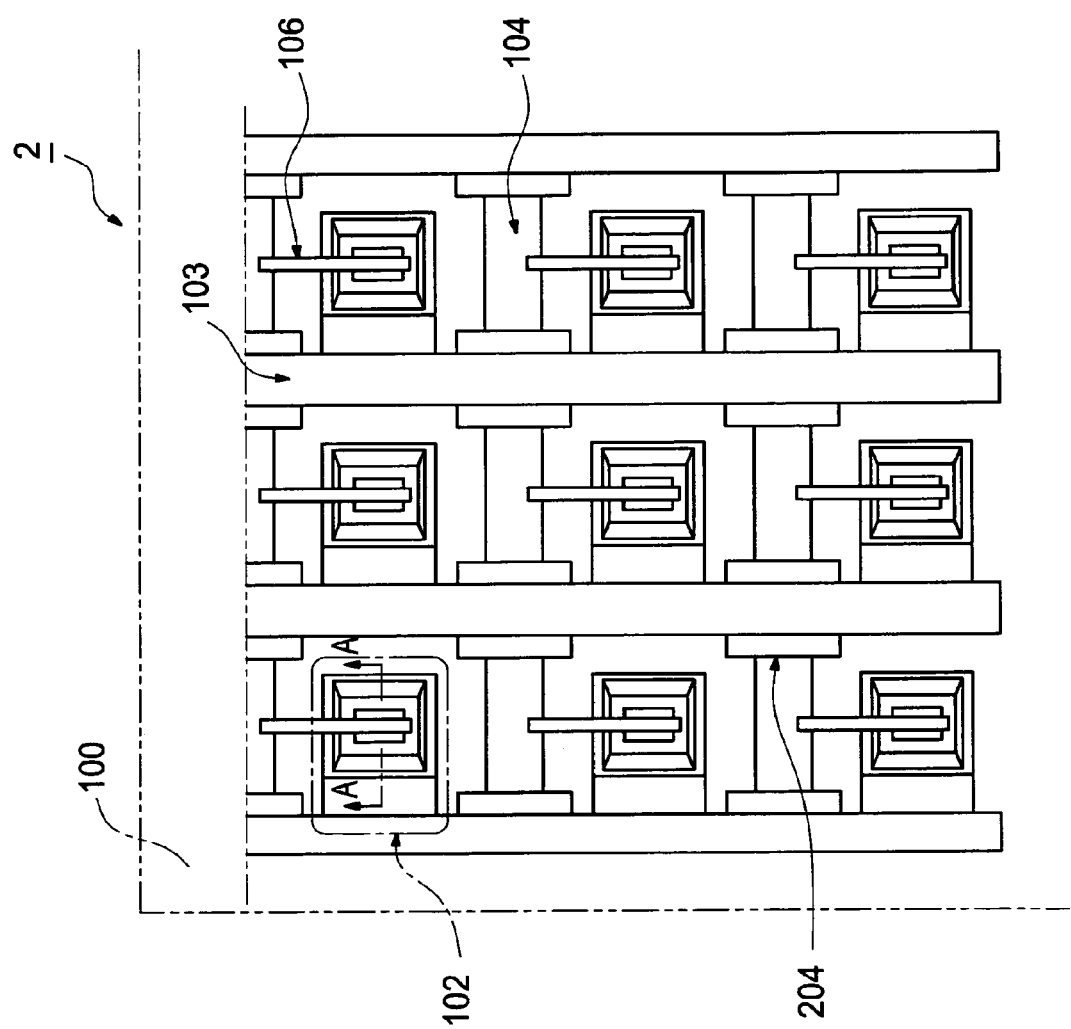
FIG. 4 is a plane enlargement drawing of Embodiment 2.
Figure 5:
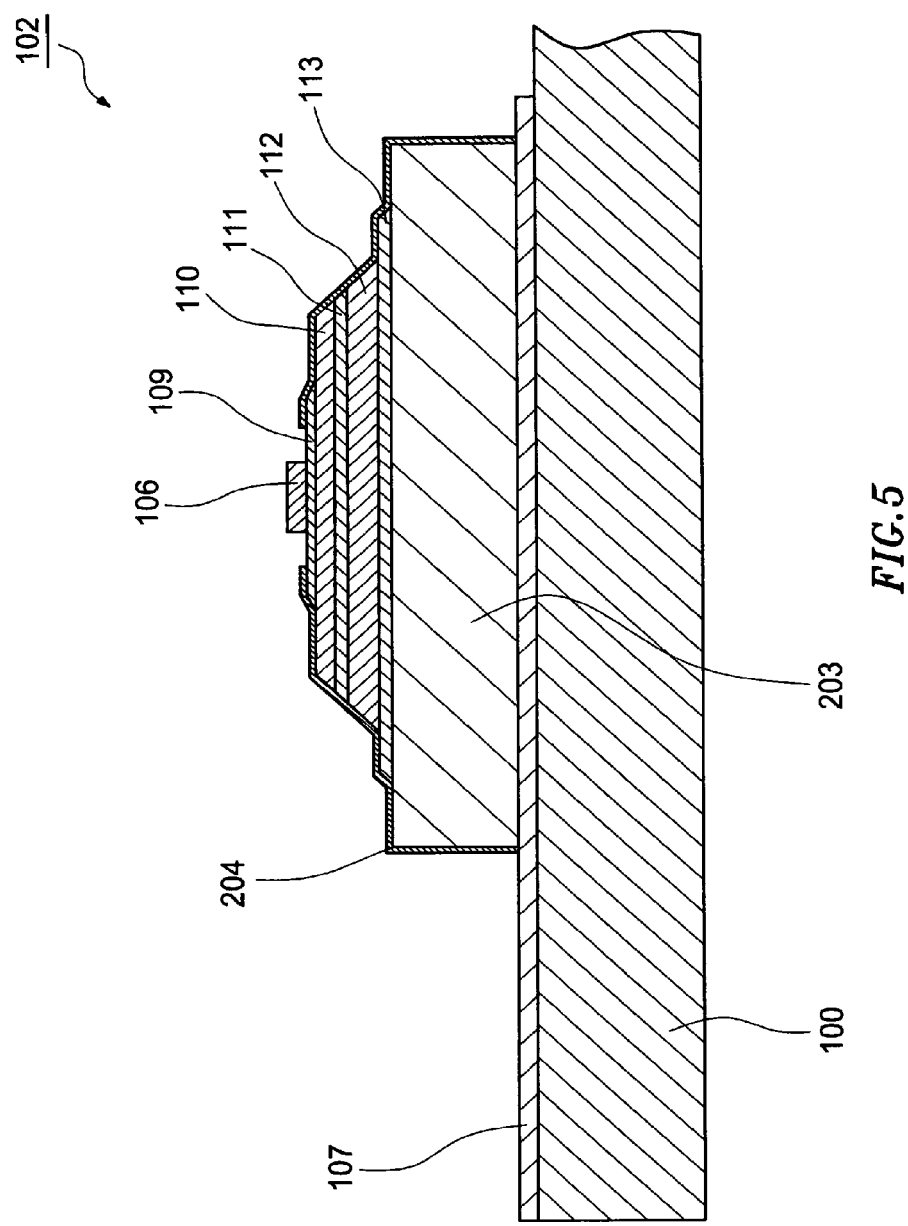
FIG. 5 is a sectional enlargement drawing showing a display apparatus in Embodiment 2.

FIG. 4 is a plane enlargement drawing of Embodiment 2; and FIG. 5 is a sectional enlargement drawing showing a display apparatus in Embodiment 2.

The FIG. 5 is an A-A sectional diagram including the thin film LED 102 in the FIG. 4.

Next is to explain the display apparatus 2 and the thin film LED 102 in detail through using the FIG. 4 and the FIG. 5. Moreover, regarding a plane drawing showing overall structure of a display apparatus in Embodiment 2, it is omitted because it is the same as FIG. 1.

As shown by the FIG. 4, the display apparatus 2 comprises a plastic substrate 100, thin film LED 102 serving as semiconductor thin film element, vertical distribution 103, transverse wiring 104, interlayer insulation film 204 and connection wiring (transverse) 106. The following is only to explain the components different from Embodiment 1, regarding the same components as Embodiment 1, they will be assigned to the same symbols and their explanations will be omitted.

The interlayer insulation layer 204 is accumulated for obtaining an interlayer insulation between the vertical wiring 103 and the transverse wiring 104, e.g. it is an insulation thin film such as oxidation silicon and etc. Further, in the present Embodiment, the interlayer insulation layer 204 also is used as insulation thin film to cover a thick film heat conductive layer 203 (FIG. 5).

As shown by FIG. 5, an upper contact layer 109, an upper clad layer 110, an active layer 111, a lower clad layer 112 and a lower contact layer 113 are accumulated. Inclined side surfaces of such layers are covered by the interlayer insulation film 204, so that the thin film LED 102 is accumulated on the plastic substrate 100 via the thick film heat conductive layer 203.

The thick film heat conductive layer 203 is a metal heat release layer with a thickness of 5 μm to 10 μm and is arranged just under a heat region of the thin films LED 102. As a thickening method, it may be electrolytic plating method; and it also may be a method to pattern as only thickening the heat region. Moreover, as electrolytic plating material, similar to Embodiment 1, many materials are available. However, such material having heat conductivity above 50 W/mK is desired.

Similar to Embodiment 1, through injecting current into between the transverse wiring 104 and the vertical wiring 103 toward a bias voltage direction, the thin film LED 102 formed on the plastic substrate 100 emits light. Further, similar to Embodiment 1, because the thin film LED 102 can be thinned to a thickness below e.g. 5 μm, it can have a flexibility. Even if while forming it on plastic substrate 100, it can operate as emitting element capable of ensuring high quality and high reliability.

Then, in Embodiment 2, because the thickened thick film heat conductive layer 203 is furnished just under the heat region, in the region heat concentrates, it is possible to partially increase heat capacity. Therefore, comparing with Embodiment 1, it is possible to process abrupt temperature change and to release heat effectively.

Explanation of Effect

Through furnishing a thickened metal heat release layer (the thick film heat conductive layer 203) just under the heat region of the thin film LED 102, heat capacity becomes big, so it is possible to process abrupt temperature change and to release heat effectively.

Embodiment 3

Figure 6:
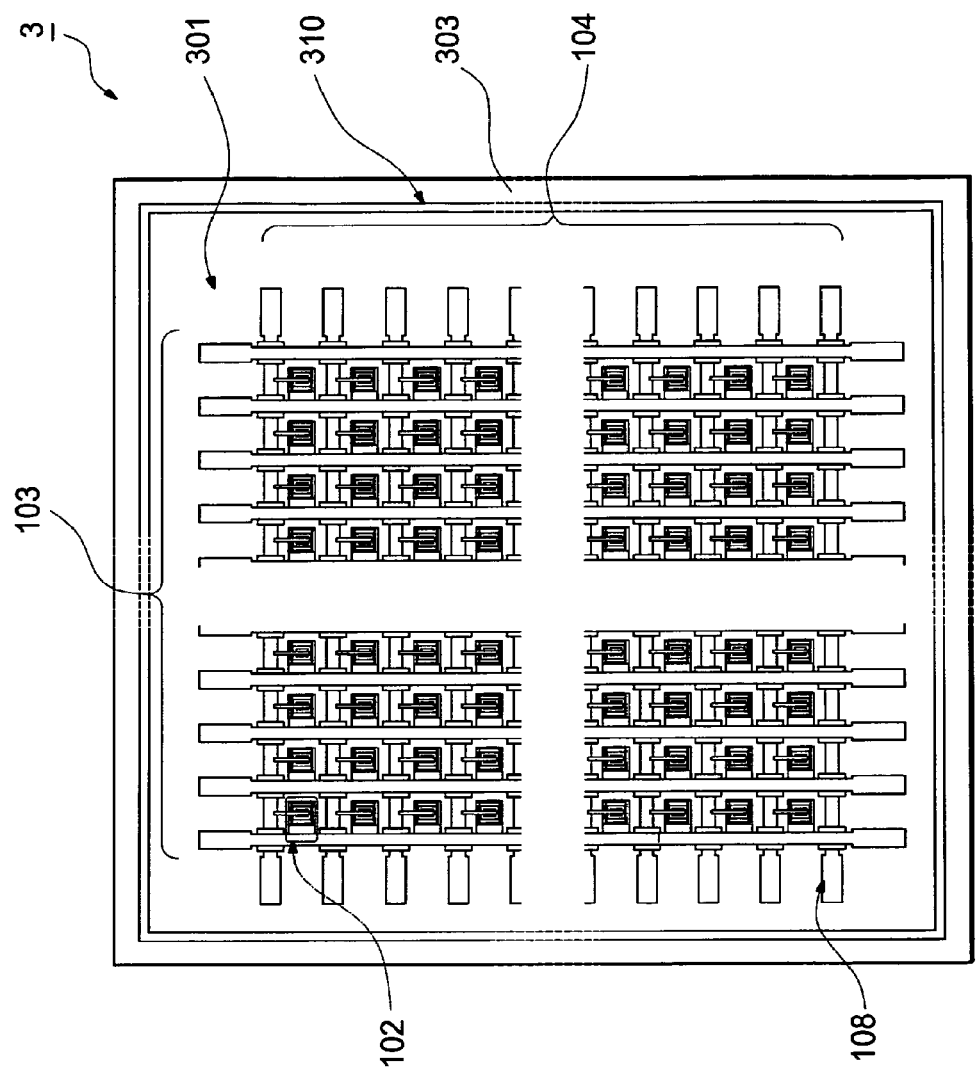
FIG. 6 is a plane drawing showing overall structure of a display apparatus in Embodiment 3.

FIG. 6 is a plane drawing showing overall structure of a display apparatus in Embodiment 3.

As shown by the FIG. 6, in the display apparatus 3 in Embodiment 3, a heat conductive layer 310 and a smooth layer 301 are accumulated on a plastic substrate, and on which a plurality of thin film LEDs 102 are accumulated as semiconductor thin film elements in a matrix manner. Further, anodes in the same queue of the thin film LEDs 102 are connected with a transverse wiring 104 having connection use pad 108, and cathodes in the same row of the thin film LEDs 102 are connected with a vertical wiring 103 having connection use pad 108. Furthermore, on the four sides surrounding the display apparatus 3, a metal frame 303 used for heat release is accumulated. Here, the metal frame 303 used for heat release is a heat release plate to absorb the heat of the thin film LED 102 via the heat conductive layer 310 and release the heat to the air.

Figure 7:
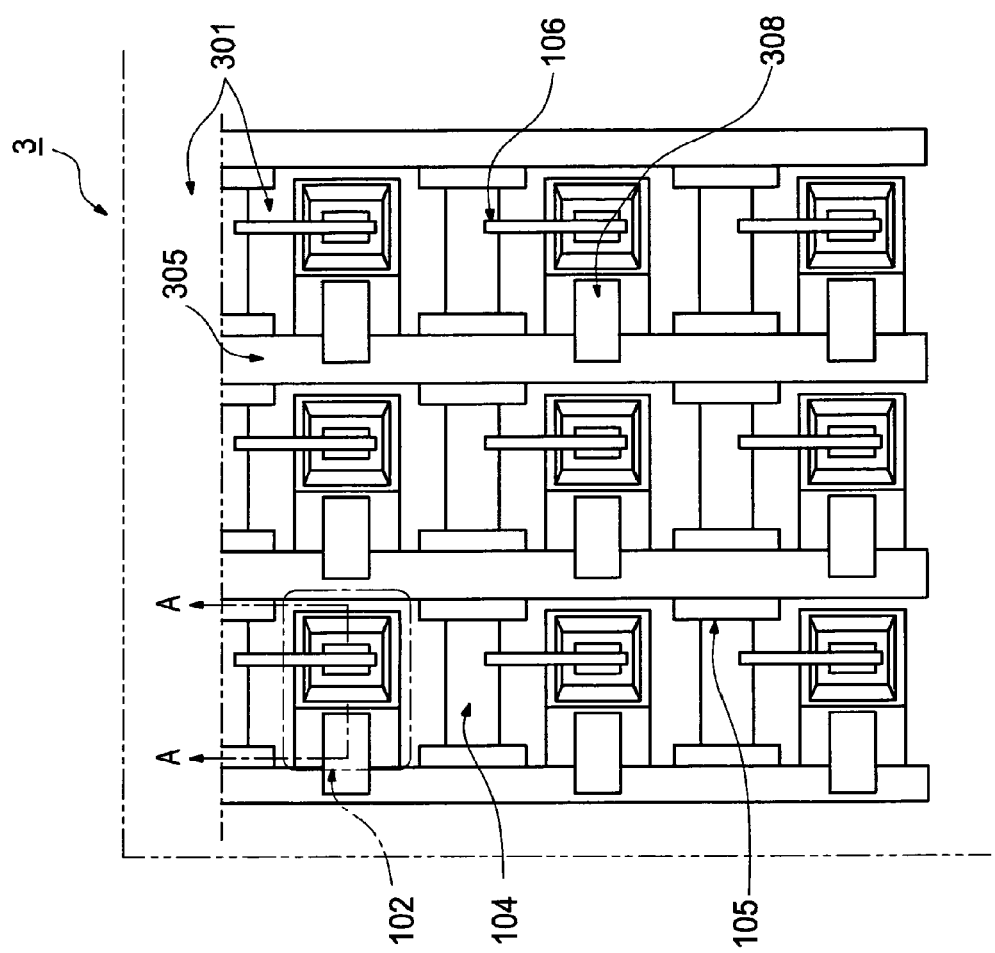
FIG. 7 is a plane enlargement drawing showing a display apparatus in Embodiment 3.
Figure 8:
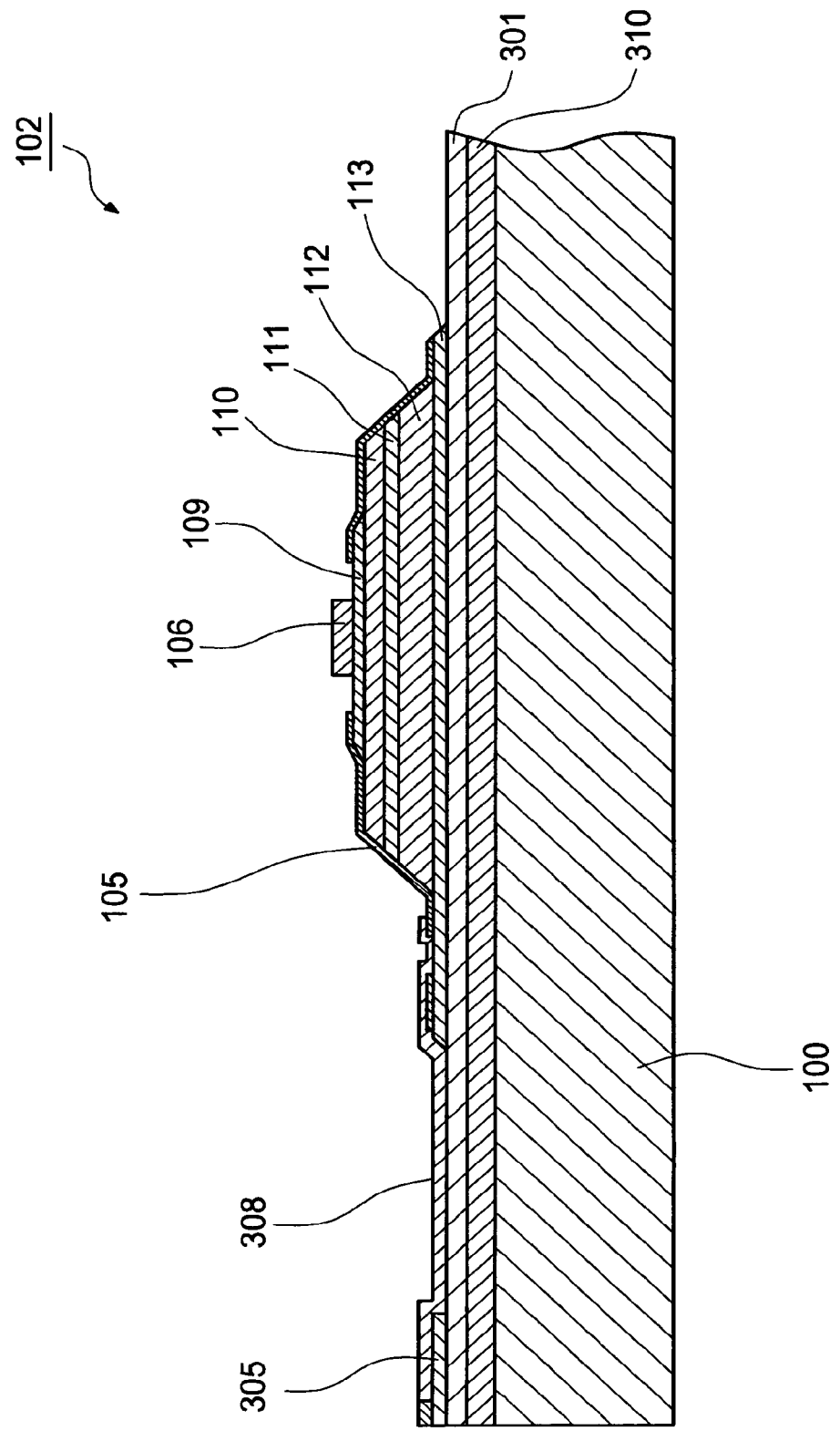
FIG. 8 is a first sectional enlargement drawing showing a display apparatus in Embodiment 3.

FIG. 7 is a plane enlargement drawing showing a display apparatus in Embodiment 3; and FIG. 8 is a first sectional enlargement drawing showing a display apparatus in Embodiment 3.

The FIG. 8 is an A-A sectional diagram including the thin film LED 102 in the FIG. 7.

Next is to explain the display apparatus 3 and the thin film LED 102 in detail through using the FIG. 7 and the FIG. 8.

As shown in FIG. 7, a display apparatus 3 comprises a thin film LED 102 accumulated on the heat conductive layer 310 (FIG. 8) and the smooth layer 301 placed on the plastic substrate 100 in a matrix form, as semiconductor thin film element; a vertical wiring 305, a transverse wiring 104, an interlayer insulation film 105, a connection wiring (transverse) 106 and a connection wiring (vertical) 308. The following is only to explain the components different from Embodiment 1, regarding the same components as Embodiment 1, they will be assigned to the same symbols and their explanations will be omitted.

The heat conductive layer 310 (FIG. 8) is a metal layer accumulated on the plastic substrate 100 for releasing heat the thin film LED 102 produced; and made of, for example, Au, AuGeNi, Al, AlNd, Ti, Ni, Pt, Ag, Pd, Cu and etc. It is formed by well-known vapor deposition method and sputter method. And the heat conductivity of the heat conductive layer 310 is better above 50 W/mK.

The smooth layer 301 is a smooth coating layer accumulated for controlling the surface roughness, that is, the typical height difference between the concave peak or convex peak and valley below about 5 nm. In order to increase heat conductivity between the thin film LED 102 and the heat conductive layer 310 without shutting off, the smooth layer 301 is set below 2 μm. Generally, the smooth layer 301 better adopts organic compound materials, oxide materials or nitride material and is formed by well-known chemical vapor deposition method (CVD method), spin coating method, slit coating method, solution-soaking coating method and spray coating method.

The vertical wiring 305 is an electroconductive thin film to connect with cathode of the thin film LED 102 formed on the plastic substrate 100. The vertical wiring 305 is a metal wiring obtained through accumulating metal material such as gold or aluminum, or above-stated metal material with nickel, or titanium or the like onto the plastic substrate 100 in a thin film lamination, and it electrically connects with cathodes of respective thin film LEDs 102. In present Embodiment, the vertical wiring 305 is not directly connected with cathode of the thin film LED 102, but is connected with the cathode of the thin film LED 102 via the connection wiring (vertical) 308.

As shown by FIG. 8, the upper contact layer 109, the upper clad layer 110, the active layer 111, the lower clad layer 112 and the lower contact layer 113 are accumulated. The thin film LED 102 whose inclined side surface is covered by the interlayer insulation film 105 is accumulated on the heat conductive layer 302 and the smooth layer 301 accumulated on the plastic substrate 100. In present Embodiment, the vertical wiring 305 is not directly connected with the lower contact layer 113 of the thin film LED 102, but is connected with the lower contact layer 113 via the connection wiring (vertical) 308.

In Embodiment, similar to Embodiments 1 and 2, through injecting current into wiring, cathode and anode toward a bias voltage direction, the thin film LED 102 formed on the plastic substrate 100 emits light. Further, because the thin film LED 102 can be thinned to a thickness below e.g. 5 μm, it can have a flexibility. Even if forming it on plastic substrate 100, it can operate as emitting element capable of ensuring high quality and high reliability.

Moreover, similar to Embodiment 1 and Embodiment 2, because formed the heat conductive layer 310 on the inner surface of the thin film LED 102, it is possible to effectively release heat produced by action of the thin films LED 102. In the present Embodiment, through coating the smooth layer 301 on the heat conductive layer 310, not only the functions in Embodiment 1 and Embodiment 2 can be obtained, but also it is possible to improve surface smoothness and obtain more solid bonding.

Explanation of Effect

In Embodiment 1 and Embodiment 2, through directly bonding the thin films LED 102 on the heat release layer (the inner surface electrode 107) and the thickened metal layer (the thick film heat conductive layer 203), the heat produced by the thin films LED 102 can be effectively released via these layers. However, in order to adjust surface roughness of such layers to below the 5 nm, enough attention must be paid with respect to film forming condition and film forming apparatus etc. And quality requirements for such films are also extremely strict. According to Embodiment, through coating the smooth layer 301 on the inner surface electrode 107, it is possible to easily adjust surface roughness to below 5 nm except the effect achieved in Embodiment 1. Therefore, it is possible to solidly bond the thin film LED 102 on the heat conductive layer 310.

The following explains expansion example of Embodiment.

Figure 9:
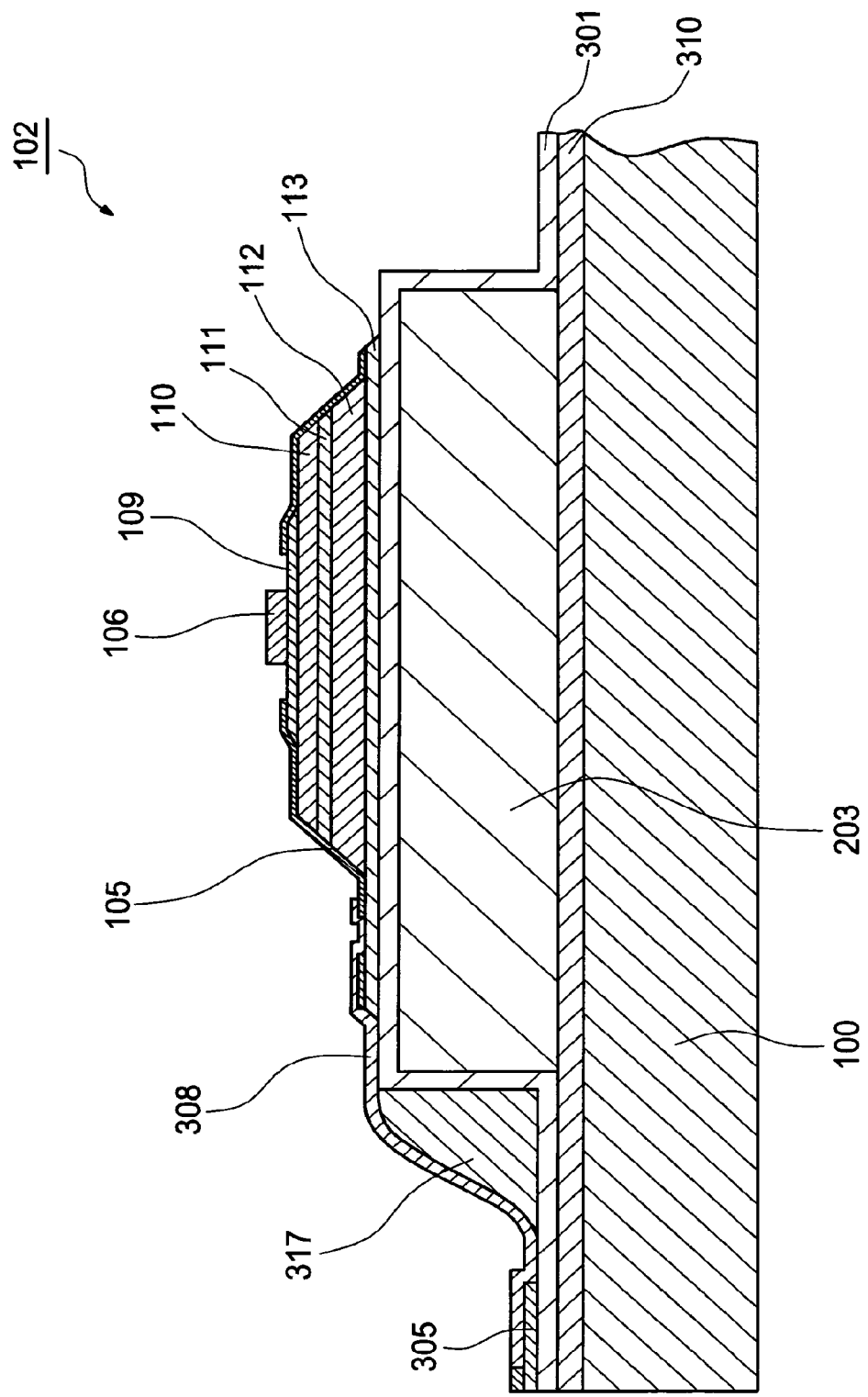
FIG. 9 is a second sectional enlargement drawing showing a display apparatus in Embodiment 3.

FIG. 9 is a second sectional enlargement drawing showing a display apparatus in Embodiment 3.

In the display apparatus 3 of Embodiment 3, a smooth layer is furnished between the inner surface electrode 107 (FIG. 3) and the thin films LED 102 (FIG. 3) of the display apparatus 1 in Embodiment 1. However, in the present expansion example, the smooth layer is furnished between the thick film heat conductive layer 203 (FIG. 5) and the thin films LED 102 (FIG. 5) of the display apparatus in Embodiment 2. In the case, through coating the surface of the thick film heat conductive layer 203 (FIG. 5), it is possible to easily adjust the surface roughness to below 5 nm. As a result, it is possible to solidly bond the thin film LED 102 (FIG. 5) on the thick film heat conductive layer 203 (FIG. 5).

Embodiment 4

Figure 10:
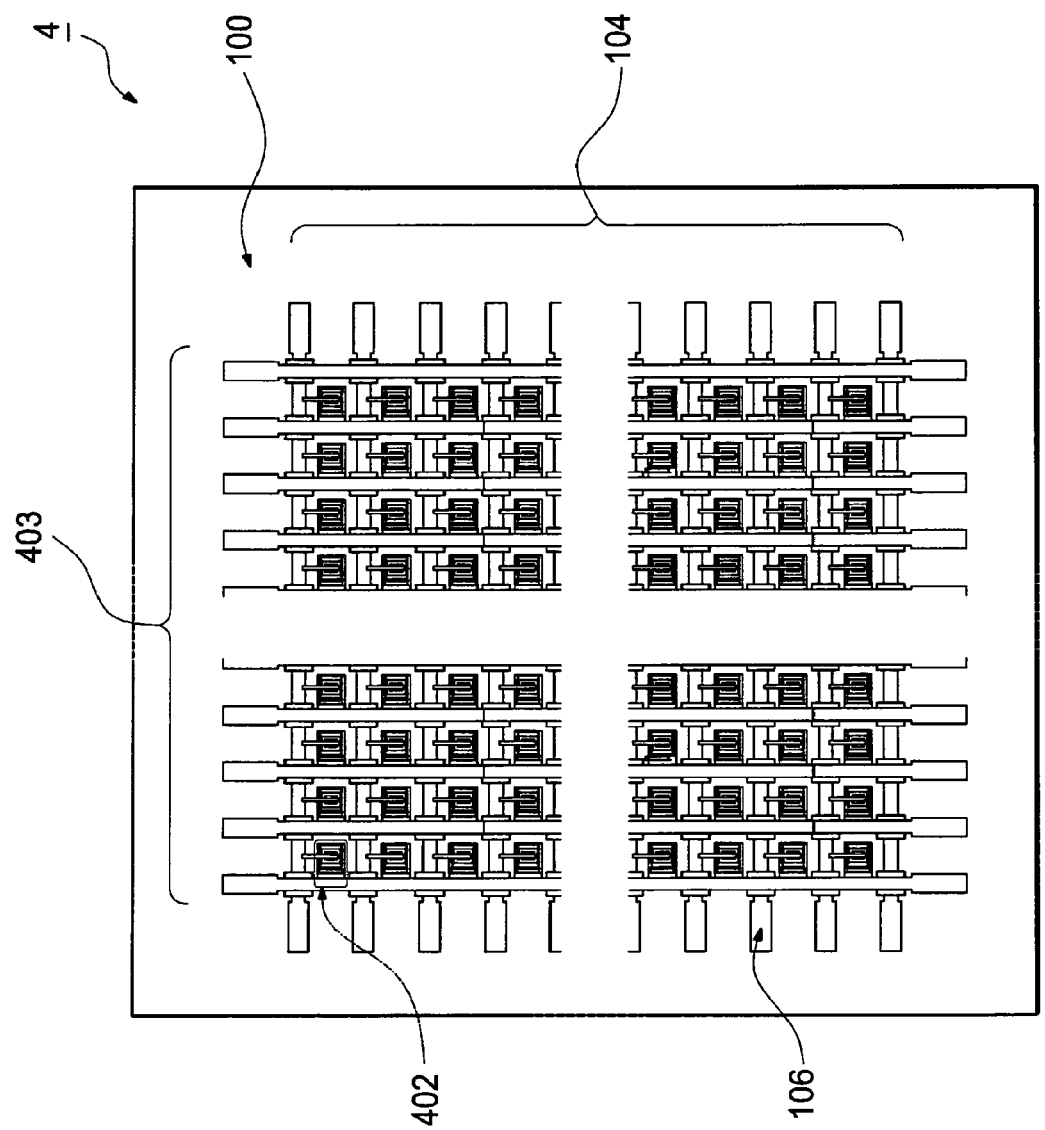
FIG. 10 is a plane drawing showing overall structure of a display apparatus in Embodiment 4.

FIG. 10 is a plane drawing showing overall structure of a display apparatus in Embodiment 4.

As shown by the FIG. 10, in the display apparatus 4 in Embodiment 4, a plurality of thin film LEDs 402 are arranged as semiconductor thin film elements in a matrix manner. Further, anodes in the same queue of the thin film LEDs 402 are connected with a transverse wiring 104 having connection use pad 108, and cathodes in the same row of the thin film LEDs 402 are connected with a vertical wiring 403 having connection use pad 108.

Figure 11:
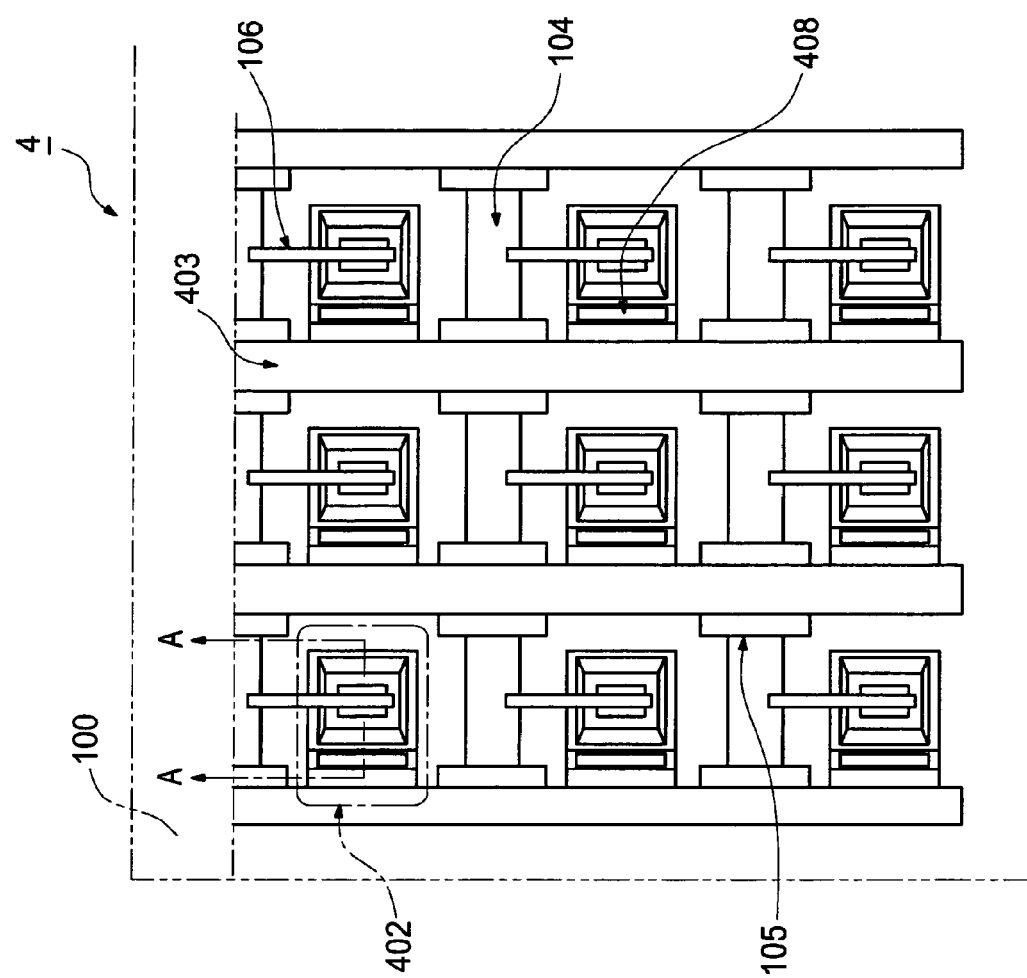
FIG. 11 is a plane enlargement drawing showing a display apparatus in Embodiment 4.

FIG. 11 is a plane enlargement drawing showing a display apparatus in Embodiment 4.

As shown in FIG. 11, a display apparatus 4 comprises a plastic substrate 100, a thin film LED 402 serving as semiconductor thin film element; a vertical wiring 403, a transverse wiring 104, an interlayer insulation film 105, and a connection wiring (transverse) 106.

Figure 12:
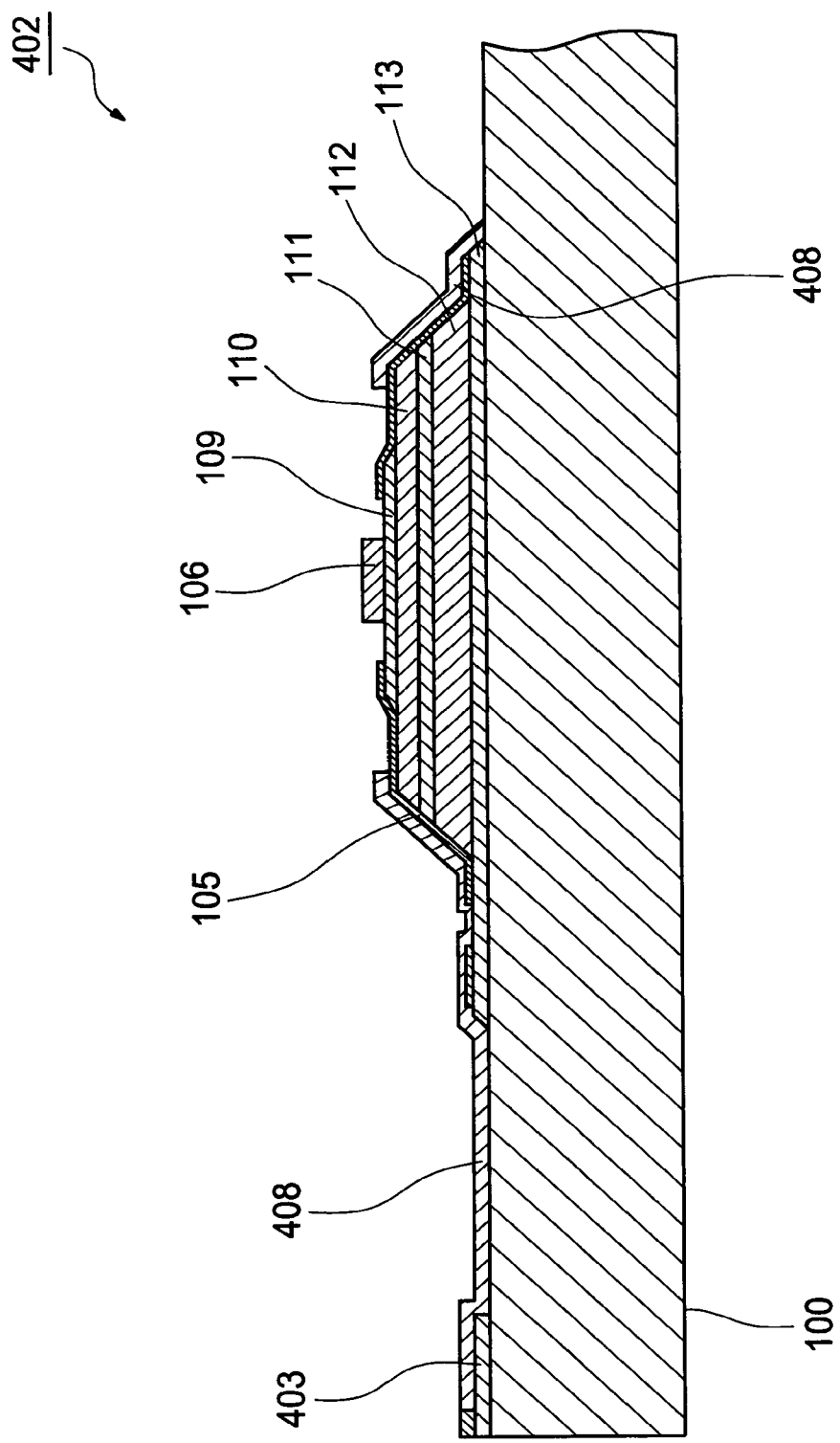
FIG. 12 is a first sectional enlargement drawing showing a display apparatus in Embodiment 4.

FIG. 12 is a first sectional enlargement drawing showing a display apparatus in Embodiment 4.

The FIG. 12 is an A-A sectional diagram including the thin film LED 402 in the FIG. 12.

Next is to explain the display apparatus 4 and the thin film LED 402 in detail through using the FIG. 11 and the FIG. 12.

As shown in FIG. 11, a display apparatus 4 comprises a plastic substrate 100, a thin film LED 402 serving as semiconductor thin film element; a vertical wiring 403, a transverse wiring 104, an interlayer insulation film 105, and a connection wiring (transverse) 106. The following is only to explain the components different from Embodiments 1 to 3, regarding the same components as Embodiments 1 to 3, they will be assigned to the same symbols and their explanations will be omitted.

The vertical wiring 403 is an electroconductive thin film to connect with cathode of the thin film LED 402 formed on the plastic substrate 100. The vertical wiring 403 is a metal wiring obtained through accumulating metal material such as gold or aluminum, or above-stated metal material with nickel, or titanium or the like onto the plastic substrate 100 in a thin film lamination, and it electrically connects with cathodes of respective thin film LEDs 402. In the present Embodiment, the vertical wiring 403 is not directly connected with the cathode of the thin film LED 402, but is connected with the cathode of the thin film LED 402 via a heat conductive layer and connection wiring 408 (FIG. 12).

As shown by FIG. 12, an upper contact layer 109, an upper clad layer 110, an active layer 111, a lower clad layer 112 and a lower contact layer 113 are accumulated. The thin film LED 402 whose inclined side surface is covered by the interlayer insulation film 105 and the heat conductive layer and connection wiring 408 is accumulated on the plastic substrate 100.

The heat conductive layer and connection wiring 408 is a thin film metal layer to cover the whole thin film LED 402 from the surface side. The thin film metal layer can be formed by a lengthy pattern of anode or cathode, also can be formed from a pattern completely separated from two poles. Moreover, the thin film metal layer can be formed by well-known vapor deposition method or sputter method; and it can be formed simultaneously with formation of anode or cathode. Considering the heat release performance of the thin film metal layer, the heat conductivity of the thin film metal layer is better above 50 W/mK.

In Embodiments 1 to 3, through improving the heat release performance from surface side of the thin film LED 402, as the element structure of the thin film LED 402 according to Embodiments 1 to 3, without furnishing a heat release layer between the thin film LED 402 and the plastic substrate 100, the heat release performance can be improved. Further, as explained in Embodiments 1 to 3, through furnishing a multiple heat release layer between the thin film LED 402 and the plastic substrate 100, the heat release performance can be more improved.

In Embodiment, similar to Embodiments 1 to 3, through injecting current into wiring, cathode and anode toward a bias voltage direction, the thin film LED 402 formed on the plastic substrate 100 emits light. Further, because the LED thin film (thin film LED 402) can be thinned to a thickness below e.g. 5 μm, it can have a flexibility. Even if forming it on plastic substrate 100, it can operate as emitting element capable of ensuring high quality and high reliability.

Explanation of Effect

As explained above, according to the present Embodiment, the heat produced by action of the thin film LED 402 can be effectively released via the heat conductive layer and connection wiring 408 furnished on the element surface side. Moreover, not only the heat conductive layer and connection wiring 408 can be formed as a lengthy pattern of anode or cathode, but also the heat conductive layer and connection wiring 408 can be formed as a pattern completely separated from two poles. Therefore, while forming the anode or the cathode, it is possible to simultaneously form the two poles to obtain such effect. Moreover, differently from Embodiments 1, 2 and 3, because the heat conductive layer and connection wiring 408 is formed on element surface of the thin film LED 402, it is possible to perform a material selection without considering a bonding strength with the plastic substrate 100. Furthermore, because the modes described with respect to Embodiments 1, 2 and 3 can be used in multiple, it is possible to further obtain an improved heat release performance.

The following explains expansion example of Embodiment.

Figure 13:
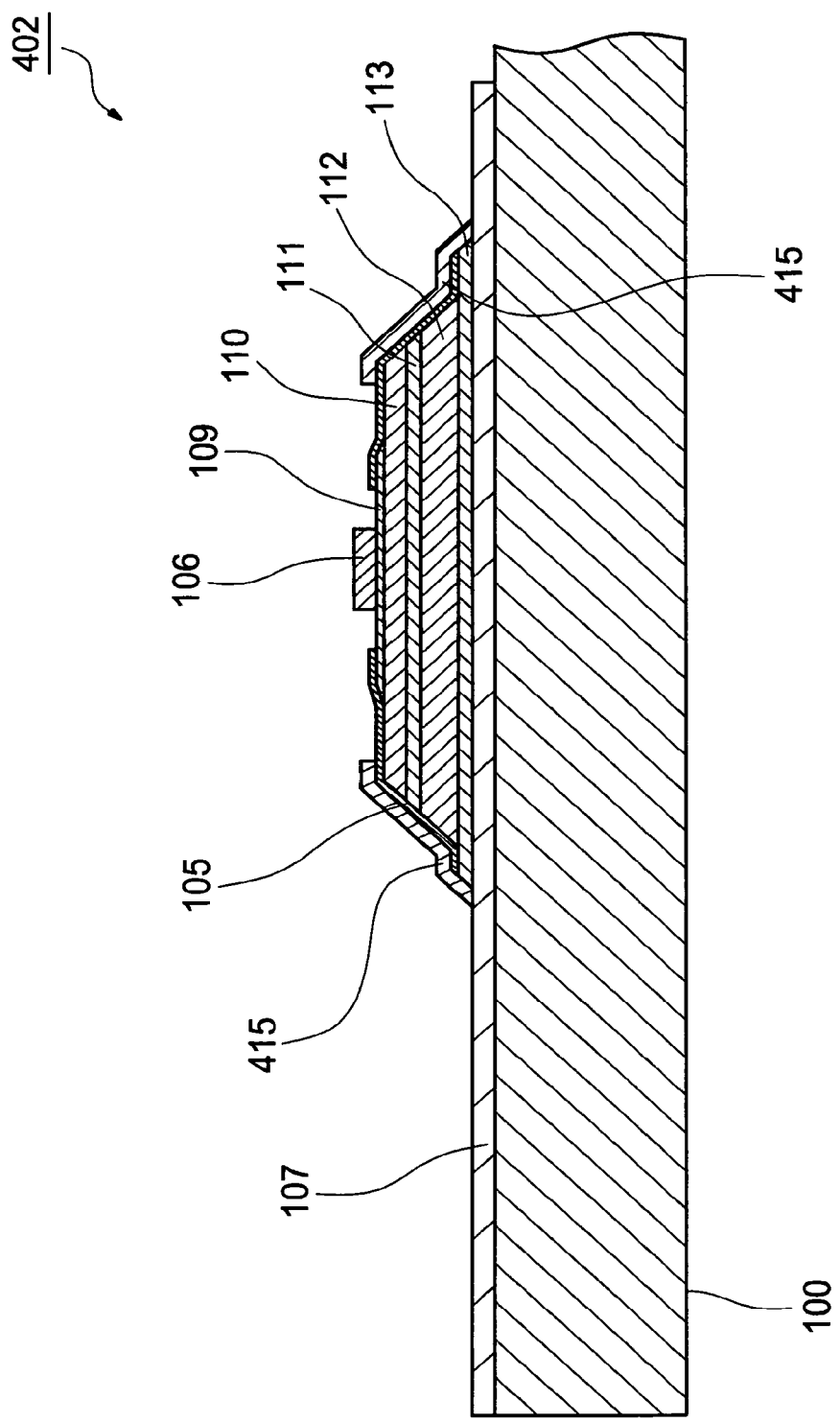
FIG. 13 is a second sectional enlargement drawing a display apparatus in Embodiment 4.

FIG. 13 is a second sectional enlargement drawing a display apparatus in Embodiment 4.

In the display apparatus 4 of Embodiment 4, the heat conductive layer and connection wiring 408 is accumulated on the element surface side of the thin film LED 102 (FIG. 8) of the display apparatus 3 of Embodiment 3. However, in the expansion example, it is to accumulate a heat conductive layer 415 on the element surface side of the thin film LED 102 (FIG. 3) of the display apparatus 1 in Embodiment 1. In the case, the same effects as Embodiment 4 can be obtained.

Embodiment 5

Figure 14:
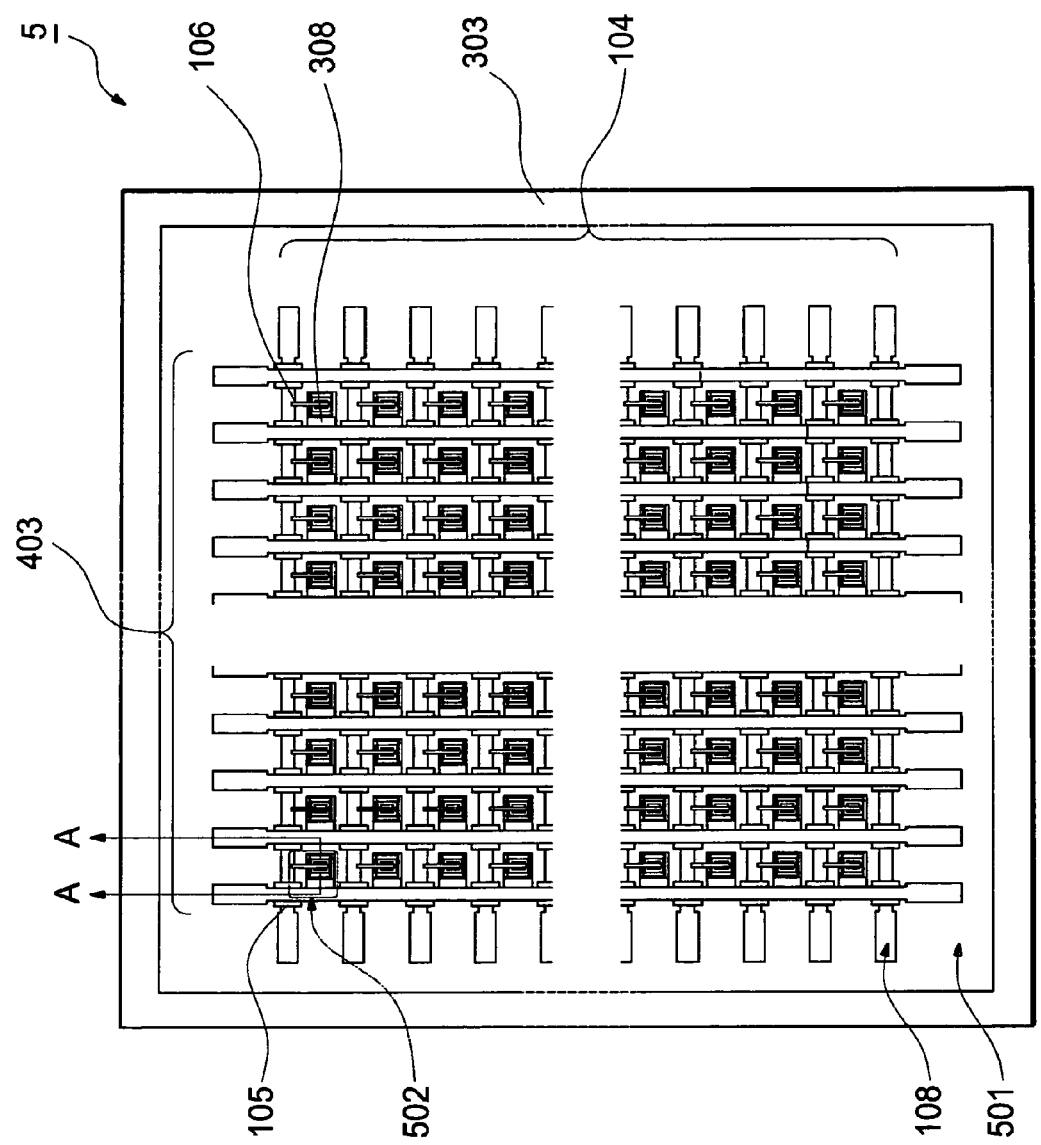
FIG. 14 is a plane drawing showing overall structure of a display apparatus in Embodiment 5.

FIG. 14 is a plane drawing showing overall structure of a display apparatus in Embodiment 5.

As shown by the FIG. 14, in a display apparatus 5 of Embodiment 5, a plurality of thin film LEDs 502 are accumulated as semiconductor thin film elements on the plastic substrate 100. Subsequently, on which a passivation film 503 (as described below) and a heat conductive layer 501 are accumulated as covering the whole display apparatus 5. The following is only to explain the components different from Embodiments 1 to 4, regarding the same components as Embodiments 1 to 4, they will be assigned to the same symbols and their explanations will be omitted.

Figure 15:
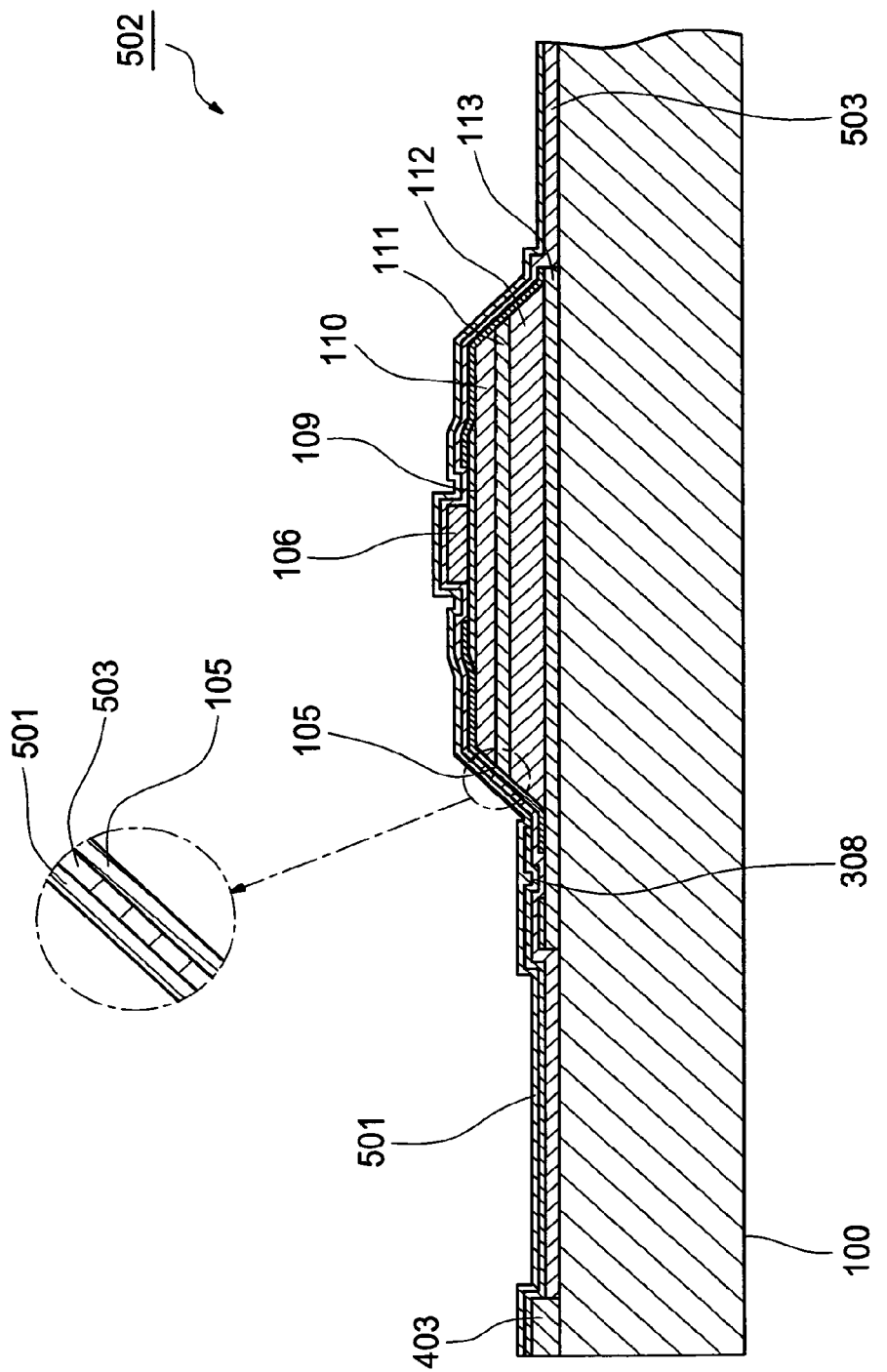
FIG. 15 is a sectional enlargement drawing showing a display apparatus in Embodiment 5.

FIG. 15 is a sectional enlargement drawing showing a display apparatus in Embodiment 5.

As shown by FIG. 15, an upper contact layer 109, an upper clad layer 110, an active layer 111, a lower clad layer 112 and a lower contact layer 113 are accumulated. The thin film LED 502 whose inclined side surface is covered by an interlayer insulation film 105, the passivation film 503 and the heat conductive layer 501 is accumulated on the plastic substrate 100.

The passivation film 503 is an insulation layer composed of a transparent oxide film or a transparent nitride film formed on element surface. The passivation film 503 must not shut off a heat conduction toward the heat conductive layer 501 with high heat conductivity placed on passivation film 503. Therefore, the passivation film 503 is better to have a film thickness above 500 nm. Moreover, the oxide film and nitride film can be formed by well-known plasma CVD method or sputter method.

The heat conductive layer 501 is a film with high heat conductivity accumulated on the passivation film 503. The heat conductive layer 501 is composed of a transparent conductive film such as ITO, $ZnO_2$, $In_2O_3$ and other, or an organic compound material with conductivity. Further, the heat conductive layer 501 can use metal material such as Au, Al and other to form film below e.g. 10 nm. Such films can be formed by well-known sputter method, vapor deposition method, spin coating method, slit coating method, solution-soaking coating method and spray coating method.

In Embodiment, similar to Embodiments 1 to 4, through injecting current into among wiring, cathode and anode toward a bias voltage direction, the thin film LED 502 formed on the plastic substrate 100 emits light. Further, like Embodiment 1, because the LED thin film (thin film LED 502) can be thinned to a thickness below e.g. 5 µm, it can have a flexibility. Even if while forming it on plastic substrate 100, it can operate as emitting element capable of ensuring high quality and high reliability.

In the element structure of the present Embodiment, because a layer for releasing heat as covering a whole surface of the element is furnished, the heat produced by action of the thin film LED 502 can be released via a layer (heat conductive layer 501) with high heat conductivity. Moreover, through using element structures of Embodiments 1 to 4 in multiple, it is possible to further effectively release heat from the surface side and the inner surface side of the thin film LED 502.

Explanation of Effect

As explained above, according to the present Embodiment, because the heat produced by action of the thin film LED 402 can be effectively released via the heat conductive layer 501 with high heat conductivity for releasing heat, furnished on the element surface side, so heat release efficiency can be improved. Moreover, according to the present Embodiment, the heat conductive layer 501 is furnished on the thin film LED 502 via the passivation film 503, it is possible to form the heat conductive layer 501 as covering the whole element of the thin film LED 502 without patterning. Therefore, a simple manufacturing method can be supplied.

In the above stated Embodiments, it only explained that the present invention is applied to display apparatuses adopting a thin film LED. However, the present invention is not limited to the case, i.e. the present invention also can be applied to any display apparatuses comprising a semiconductive element capable of being accumulated on a plastic substrate.

The present invention is not limited to the foregoing Embodiments but many modifications and variations are possible within the spirit and scope of the appended claims of the invention.

What is claimed is:

1. A display apparatus comprising:
   a plastic substrate;
   a semiconductor thin film element bonded to the plastic substrate, the semiconductor thin film element having a first surface and a second surface opposite the first surface, the first surface facing the plastic substrate, the semiconductor thin film element including a contact part provided on the second surface; and
   a thin film metal layer for promoting heat release, the thin film metal layer being formed so as to have a portion that is disposed on the second surface and closer to the second surface than the first surface, the thin film metal layer extending to a vicinity of the contact part but not directly contacting the contact part.

2. The display apparatus according to claim 1, further comprising one of an anode and a cathode, wherein the thin film metal layer is formed from a pattern of the one anode and cathode.

3. The display apparatus according to claim 1, wherein the semiconductor thin film element is provided in a plural number in a matrix format on the plastic substrate.

4. The display apparatus according to claim 1, wherein the semiconductor thin film element is bonded, through an intermolecular force of a hydrogen bond, on the thin film metal layer.

5. The display apparatus according to claim 1, further comprising a vertical wiring layer made of gold, aluminum, gold mixed with nickel, gold mixed with titanium, aluminum mixed with nickel, or aluminum mixed with titanium, wherein
the thin film metal layer is connected to the vertical wiring layer, the vertical wiring layer is integral with the thin film metal layer, and
the thin film metal layer extends on the plastic substrate.

6. The display apparatus according to claim 5, wherein the thin film metal layer is made of Au, AuGeNi, Al, AlNd, Ti, Ni, Pt, Ag, Pd, Cu, ITO, $ZnO_2$, or $In_2O_3$.

7. The display apparatus according to claim 1, wherein the semiconductor thin film element is a thin film LED.

8. The display apparatus according to claim 1, wherein the thin film metal layer has a thickness of not more than five micrometers.

9. The display apparatus according to claim 1, wherein the plastic substrate is made of an organic material that is one of polyethylene terephthalate, polyimide, polycarbonate, polyethylene naphthalate, and aramid.

10. The display apparatus according to claim 1, wherein the plastic substrate has a surface roughness of 5 nm or less.

11. The display apparatus according to claim 1, further comprising an insulation film provided in direct contact with the semiconductor thin film element, and the thin film metal layer is provided in direct contact with the insulation film.

12. The display apparatus according to claim 1, wherein the thin film metal layer extends from a lower part of the semiconductor thin film element to an upper part of the semiconductor thin film element along a side surface of the semiconductor thin film element.

13. The display apparatus according to claim 1, further comprising a cathode wiring, wherein the thin film metal layer extends from the cathode wiring to the second surface of the semiconductor thin film element.

14. The display apparatus according to claim 13, further comprising:
an insulation film; and
an anode wiring,
wherein the cathode wiring is provided on the insulation film, and the insulation film is provided on the anode wiring.

15. The display apparatus according to claim 1, further comprising another metal layer, wherein
the contact part is connected to the another metal layer, and
the another metal layer and the thin film metal layer are provided separately.

16. A display apparatus comprising:
a plastic substrate;
a semiconductor thin film element bonded to the plastic substrate, the semiconductor thin film element having a first surface and a second surface opposite the first surface, the first surface facing the plastic substrate;
a thin film metal layer for promoting heat release, the thin film metal layer being formed so as to have a portion that is disposed on the second surface and closer to the second surface than the first surface;
a transparent passivation film provided on substantially the whole second surface of the semiconductor thin film element; and
a transparent thin film metal layer formed on the transparent passivation film.

17. The display apparatus according to claim 16, wherein the semiconductor thin film element includes a contact part provided on the second surface of the semiconductor thin film element,
further wherein the thin film metal layer extends to a vicinity of the contact part but does not directly contact the contact part.

18. A display apparatus comprising:
a plastic substrate;
a semiconductor thin film element bonded to the plastic substrate, the semiconductor thin film element having a first surface and a second surface opposite the first surface, the first surface facing the plastic substrate; and
a thin film metal layer for promoting heat release, the thin film metal layer being formed so as to have a portion that is disposed on the second surface and closer to the second surface than the first surface, the thin film metal layer not being connected to a wiring, and the thin film metal layer being presented independently.

* * * * *